United States Patent [19]
Hamparian

[11] Patent Number: 5,955,927
[45] Date of Patent: Sep. 21, 1999

[54] RF POWER TRANSISTOR CONTROL USING COLLECTOR CURRENT

[75] Inventor: Simon Hamparian, Palisades Park, N.J.

[73] Assignee: Lucent Technolgies Inc, Murry Hill, N.J.

[21] Appl. No.: 09/063,229

[22] Filed: Apr. 20, 1998

[51] Int. Cl.⁶ .............................. H02H 7/20; H03G 3/10
[52] U.S. Cl. ...................... 330/298; 330/284; 330/281
[58] Field of Search ........................ 330/298, 207 P, 330/279, 284, 136, 281; 455/115

[56] References Cited

U.S. PATENT DOCUMENTS

| | | | |
|---|---|---|---|
| 4,547,746 | 10/1985 | Erickson et al. | 330/298 |
| 5,121,076 | 6/1992 | Lendaro | 330/281 |
| 5,497,125 | 3/1996 | Royds | 330/298 |

*Primary Examiner*—Robert Pascal
*Assistant Examiner*—Patricia T. Nguyen

[57] ABSTRACT

In an amplifier apparatus of the type including an RF power transistor output stage, the control circuitry of the invention provides an automatic gain control mode of operation for its power transistor of a first response time and a power limiting mode of operation for its transistor of a second, faster response time, and with the power limiting mode of operation being switched into effect in response to the sensing of the collector current flow of the power transistor beyond a prescribed value.

11 Claims, 2 Drawing Sheets

RF POWER TRANSISTOR CONTROL USING COLLECTOR CURRENT

BACKGROUND OF THE INVENTION

1. Field of the Invention

This invention relates to amplifier apparatus including a radio frequency (RF) power transistor output stage and, more particularly, to such amplifier apparatus as operates at very high frequencies.

2. Description of the Related Art

Amplifier apparatus operating with RF power transistor output stages conventionally include automatic gain control (AGC) circuitry to maintain the output power substantially constant in the presence of variations in supply voltages, temperature, frequency, etc. Typically, direct voltages are monitored at various locations in the amplifier apparatus, and utilized to vary the attenuation in the amplifier—for example, through the use of a voltage controlled attenuator at the amplifier input. At the same time, power limiting control circuitry is incorporated in the apparatus to monitor the power in the transistor output stage, to again vary the attenuation in keeping the output power below a predetermined level. In the usual manner of operation, switching essentially occurs between the AGC mode of operation, and the power limiting mode of operation, depending upon the magnitude of the direct voltage generated from the power transistor output at any instant of time. In these arrangements, the direct voltage is generated by RF diode detector circuits which generate DC voltages proportional to the RF output power of the amplifier.

While such controlled switching has performed adequately well, analysis has shown that the performance deteriorates significantly at very high frequencies. At frequencies, for example, of the two Gigahertz utilized with personal communication services (PCS) phones in a Time Division Multiple Access (TDMA) system, the Base Station employed is generally unable to respond fast enough to protect the output power transistor from destruction during those situations where the input control is suddenly increased—as may be the case with radios, which drive the power amplifier, and which employ dynamic power control (DPC). Even though temperature compensation circuits may be included in an attempt to protect against this where ambient temperature suddenly rises, the operation of the conventional power limiting control circuit has been determined to be of little use in quickly responding when the failure follows from a mistaken belief that the volume setting on the amplifier apparatus is too low and requires increase, when, in fact, the minimal output detected results from a malfunction in the components coupled between the amplifier output and the transmitting antenna. As will be appreciated, continuing to increase the volume setting in those circumstances only serves to destroy the output power transistor.

SUMMARY OF THE INVENTION

As will become clear from the following description, the improvement of the present invention follows from a monitoring of the power generated by the RF power transistor through a monitoring of its collector current, rather than from a monitoring of a voltage developed from that transistor in operation. As will be appreciated, monitoring of the current eliminates the need for diode detectors in converting the power developed into direct voltages proportional to the power, while at the same time eliminates the need for temperature compensation because of the collector efficiency of the transistor—which changes very little with temperature. Automatic gain control continues to be available through an OR circuit having a first input to receive a direct voltage proportional to the collector voltage of the power transistor, as before, and with a second input coupled to receive a direct voltage proportional to this collector current flow. With the output of the OR circuit coupled to a voltage controlled attenuator of the amplifier, the AGC and power limiting controls of the amplifier continue, but with a faster response in protecting the power output transistor against substantial increases in collector current—as might otherwise result from a sudden increase in an input amplifier control setting. As collector efficiencies of RF output transistors have been noted to vary one from another—even of the same manufacture and type the power limiting control circuitry of the invention includes a control for adjustably setting that prescribed level of collector current at which the power limiting circuitry of the invention takes-over. Such adjustable setting will be appreciated to be one made at a factory location when originally delivering the amplifier apparatus, or at a field location in the event a power transistor needs to be replaced at a later time.

BRIEF DESCRIPTION OF THE DRAWING

These and other features of the present invention will be more clearly understood from a consideration of the following description in which.

DETAILED DESCRIPTION OF THE INVENTION

Figure 1:
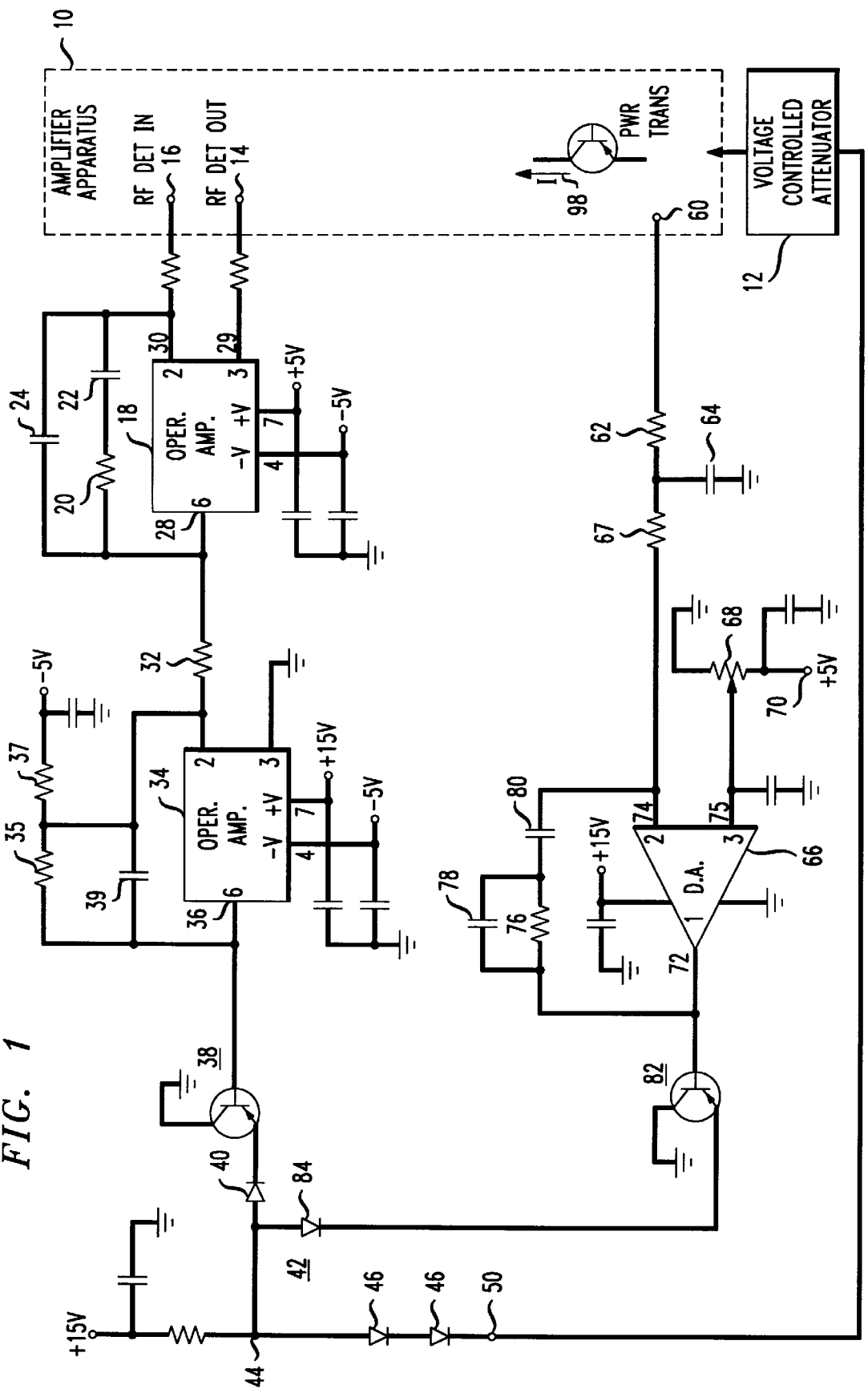
FIG. 1 is a schematic drawing showing, in partial block form, the automatic gain control circuitry and power limiting control circuitry arranged in an OR configuration to maintain the amplifier apparatus either in a AGC mode of operation or a power limiting mode of operation depending upon the collector current flow of the output transistor utilized.

In FIG. 1, a typical amplifier 10 having an RF power transistor output stage is shown, along with a voltage controlled attenuator 12 for changing the gain of the amplifier 10 as a function of a direct voltage applied to it ($V_c$), in maintaining the gain constant. An RF output detector is shown at 14, for providing a direct voltage which is proportional to the power developed by the amplifier 10. An RF detector input is shown at 16, for providing a direct voltage which is proportional to the input power to the amplifier 10. Both direct voltages are coupled to an automatic gain control circuit, including an operational amplifier 18 exhibiting a very high DC open loop gain, with a feedback network of resistor 20 and capacitors 22, 24 from its output terminal 28 to its input terminal 30. In use, the operational amplifier 18 varies its output voltage at terminal 28 to that level which maintains the voltages at the terminals 29, 30 equal, through the feedback network, as when the voltage at terminal 29 tends to change because of temperature variations, or gain variations within the amplifier stage. Resistor 20 and the two capacitors 22, 24, in this manner, may be of 10K, and 0.01 $\mu$f value, respectively.

The direct voltage developed at output terminal 28 is applied through a resistor 32 into a second operational amplifier 34 arranged as an inverting amplifier, with resistors 35, 37 and capacitor 39. The direct voltage developed at output terminal 36 of the amplifier 34 is coupled to the base of a transistor 383, whose emitter is connected to the cathode of a diode 40 arranged as part of an OR circuit 42. The output 44 of the OR circuit 42 is coupled by a pair of level-shifting diodes 46, in developing a direct voltage which is coupled, as indicated, to the voltage controlled attenuator 12 in adjusting the amplifier gain. Any tendency for the direct voltages at the terminals 14 or 16 to vary as a result of changes in supply voltage, temperature, frequency, etc. is sensed by the operational amplifiers 18, 34, to generate an AGC direct voltage at terminal 50 for changing the attenuation of the voltage controlled attenuator 12 in maintaining gain control of the amplifier 10. As will be appreciated, there is an inherent delay in the operation of the RF detector and in the operational amplifiers 18, 34 in generating the control voltage as these parameters vary. Where the variation in AGC voltage results from changes in the power developed by the amplifier, such inherent delay can result in the output transistor destructing before the control sets in, especially when the amplifier is operating at frequencies of the order of two Gigahertz, and more. Resistor 35 and 37, in a preferred embodiment of the invention, may be of value 26.1K and 17.8K respectively, while capacitor 39 may be of 6800 pf value. Resistor 32, at the same time, may be 22.1K.

In the amplifier 10, however, a differential amplifier is also included (not shown), which typically generates a direct voltage proportional to the collector current of the power transistor. Such direct voltage, according to the invention, is made available at terminal 60, where it is coupled by a low-pass filter of resistor 62 (20.5K) and capacitor 64 (0.01 $\mu$f), and by a resistor 67 (1K), to an input terminal 74 of a differential amplifier 66. A reference voltage is provided at terminal 75 of the differential amplifier 66 by means of a potentiometer 68 (5K) coupled to a direct voltage supply at 70. The potentiometer 68 is intended, as an initial factory adjustment, to set a reference voltage, or threshold, at which the differential amplifier 66 is triggered—although it is also available as a field adjustment of the amplifier in the event the RF power transistor is later replaced. A feedback network around the amplifier 66, from its output terminal 72 to its input terminal 74, includes a resistor 76 and capacitors 78, 80 of values to stabilize the loop against oscillation, yet fast enough to provide the required control response. Such resistor 76 may be 24.9K, while capacitors 78,80 may each be of 680 pf value.

As indicated, the output terminal 72 of the differential amplifier 66 is also coupled to the base of a transistor 82 whose emitter is coupled to the cathode of a second diode 84 in the OR circuit 42. Both transistors 38 and 82 are arranged as emitter-followers to obtain the current capacity needed to drive the voltage controlled attenuator 12.

One of the advantages of the arrangement as described is that the direct voltage provided at terminal 60 as being proportional to the collector current flow of the power transistor is already available in many amplifier configurations as indicative of the operating condition of the amplifier—to provide a visual indication of transistor failure, for example. Another advantage follows from its being substantially unaffected by temperature variation within the amplifier, so that it can be utilized without any added need for temperature compensation. Although collector efficiencies can vary between transistors, even of the same manufacture and type, any differences between comparable operations can be offset by adjusting the setting of potentiometer 68. Because the direct voltage at terminal 60 essentially represents the direct voltage at the collector of the power transistor—and is then coupled to the diode OR circuit only by the differential amplifier 66—the time in providing the OR circuit output voltage at terminal 50 is much less than the time it takes for the AGC control to develop at terminal 50 through a sensing of the diode detector voltages and then coupling them by means of the operational amplifiers 18, 34 to the OR circuit 42. The response of the voltage control attenuator 12 under such circumstances will be appreciated to be much faster.

Thus, with the arrangement as shown in FIG. 1, the power limiting sensing circuitry is OR'ed with the AGC circuitry, with both being used to control the attenuator 12 in the amplifier input to limit the power generated. With an input power of +10 dbm, for example, and with an output power generated of 46.8 dbm, any increase of input power of the order of 5 db, as an illustration (which would otherwise destroy the power transistor) is limited by the detected change in the collector current flow in providing 5 db more attenuation through the voltage controlled attenuator 12, so that the output power of the amplifier remains constant, and its transistor output stage protected.

While applicant does not wish to be limited to any particular set of values or components in the operation of the protective circuitry of the drawing, the desired results were obtainable utilizing operational amplifiers 18, 34 from Linear Technology as its component LT 1097_SOIC, and Linear Technology's 1213 CS8 as the differential amplifier 66—as well as Motorola transistors MJD32 for transistors 38 and 82, and Motorola MMBD2836 diodes for the components 40, 46 and 84. In a preferred construction of the invention, the potentiometer 68 is placed on a printed wiring board so as to be accessible through an aperture in the housing for the amplifier apparatus, to afford easy adjustment in setting the prescribed threshold level in switching the amplifier from its automatic gain control mode of operation to its power limiting mode of operation. As will be seen, this monitoring of the collector current flow of the power transistor affords the fast response time of protection without the need for any detector circuit in its path, and without any requirement for temperature compensation. As will also be apparent, the power limiting circuit thus provided also operates with voltages already present in the amplifier apparatus, so as to keep to a reasonably low amount any additional components needed to be added in providing the desired, faster response in the switching of the amplifier apparatus from its automatic gain control mode of operation to its power limiting mode of operation in the presence of increasing power transistor current flows.

Figure 2:
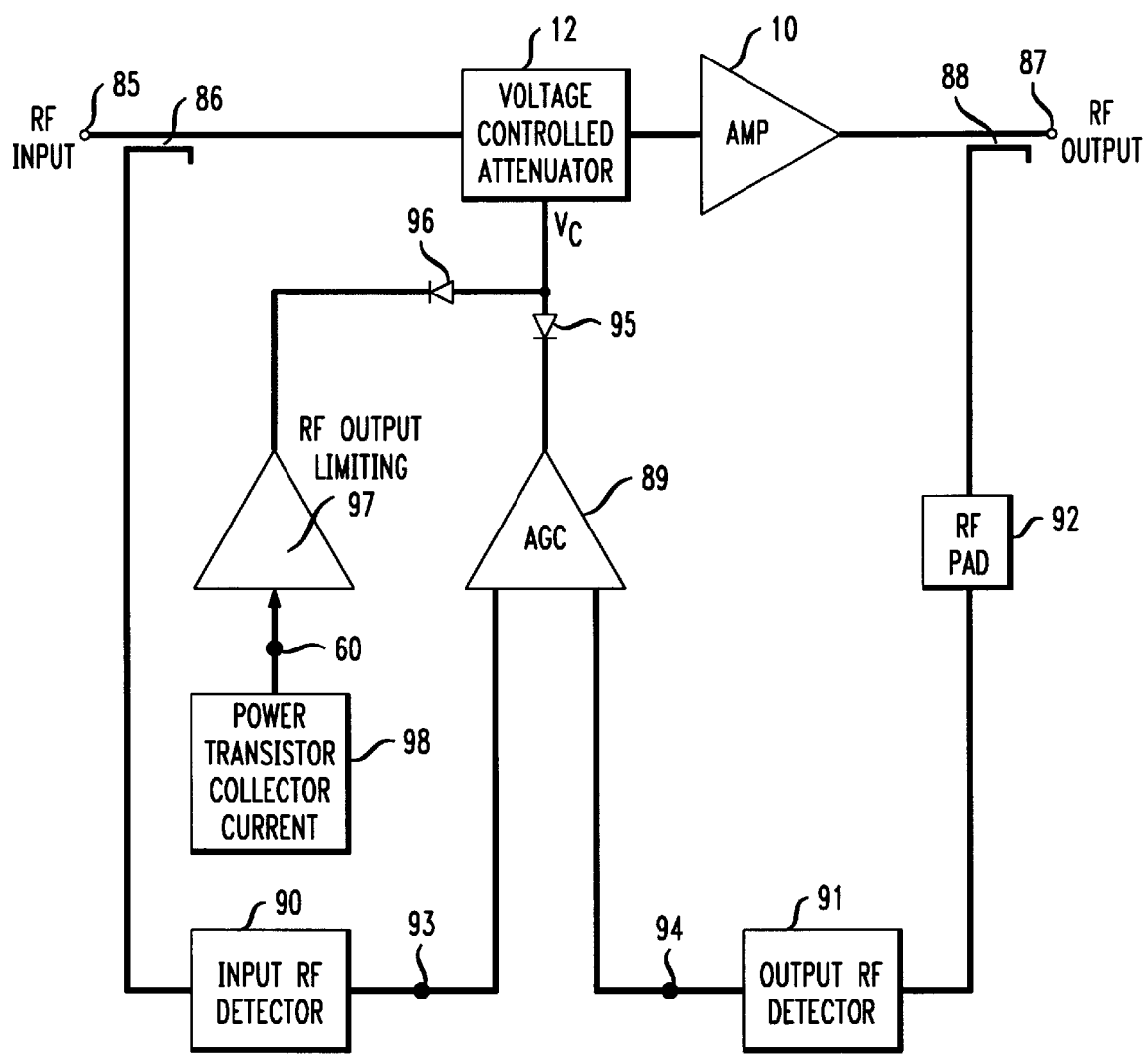
FIG. 2 is a block diagram, partially in schematic form, helpful in understanding the operation of the circuitry of FIG. 1.

In the arrangement of FIG. 2, an RF input received at terminal 85 is applied by a 10 dB coupler 86 to the voltage controlled attenuator 12, and is coupled from there by the amplifier 10 and a 23 dB output coupler 88 to the RF output terminal 87. The automatic gain control circuit is shown at 89, for comparing input signals applied by a first RF detector 90 with output signals applied by a second RF detector 91—with the detector 90 operating in conjunction with the input coupler 86, and with the detector 91 operating in conjunction with a 25 dB RF pad 92 fed from the output coupler 88. Terminal 93 on the detector 90 and terminal 94 on the detector 91 will be understood to correspond to the terminals 16 and 14, respectively, in FIG. 1. Diodes 95 and 96 similarly correspond to the diodes 84, 40 of FIG. 1, the first being operative with the output current limiting circuitry 97, and the second being operative with the automatic gain control circuitry 89. In this respect, the voltage controlled attenuator 12 may be formed as a conventional PIN diode attenuator, whose attenuation changes as a function of the control voltage applied. Such voltage is shown by the notation $V_c$ in FIG. 2. The collector current of the output transistor being protected is shown as 98 in both FIGS. 1 and 2.

Whereas there has been described what is considered to be a preferred embodiment of the present invention, it will be appreciated by those skilled in the art that modifications can be made without departing from the scope of the teachings herein of utilizing the collector current in controlling the RF power transistor of the amplifier apparatus. For at least such reason, therefore, resort should be had to the claims appended hereto for a true understanding of the scope of the invention.

I claim:

1. In an amplifier apparatus including an output stage having an RF power transistor, and incorporating an automatic gain control mode of operation for a generated power below a predetermined level and a power limiting mode of operation for generated power beyond said predetermined level, the improvement comprising:

first means monitoring the power generated by said amplifier apparatus by monitoring the collector current of said RF power transistor; and second means switching said amplifier apparatus from said automatic gain control mode of operation to said power limiting mode of operation in response to the monitoring of said collector current in excess of a prescribed value; and wherein said second means includes an OR circuit having a first input terminal to receive a voltage proportional to the collector voltage of said power transistor, and a second input terminal to receive a voltage proportional to the collector current of said power transistor.

2. The improvement of claim 1 wherein said second means includes an OR circuit having a first input terminal to receive a direct voltage proportional to the collector voltage of said power transistor and a second input terminal to receive a direct voltage proportional to the collector current of said power transistor beyond said prescribed value.

3. The improvement of claim 2 wherein there is also included third means adjustably setting said prescribed value of said collector current.

4. The improvement of claim 3 wherein said OR circuit also includes an output terminal coupled to a voltage controlled attenuator at an input terminal of said amplifier apparatus.

5. In an amplifier apparatus including an RF power transistor output stage, the improvement comprising:

first means providing an automatic gain control mode of operation for said power transistor of a first response time; and second means providing a power limiting mode of operation for said power transistor of a second, faster response time; and wherein said first means provides said automatic gain control mode of operation in response to variations in the collector voltage of said power transistor and wherein said second means provides said power limiting mode of operation in response to the collector current of said power transistor.

6. In an amplifier apparatus including an output stage having an RF power transistor, and incorporating a first automatic gain control mode of operation for a generated power below a predetermined level and a second, separate, independent power limiting mode of operation for generated power beyond said predetermined level, the improvement comprising:

first means monitoring the power generated by said amplifier apparatus by monitoring the collector current of said RF power transistor; and second means switching said amplifier apparatus from said first automatic gain control mode of operation to said second, separate, independent power limiting mode of operation in response to the monitoring of said collector current in excess of a prescribed value.

7. The improvement of claim 6 wherein said second means includes an OR circuit having a first input terminal to receive a voltage proportional to the collector voltage of said power transistor, and a second input terminal to receive a voltage proportional to the collector current of said power transistor.

8. The improvement of claim 6 wherein said second means includes an OR circuit having a first input terminal to receive a direct voltage proportional to the collector voltage of said power transistor and a second input terminal to receive a direct voltage proportional to the collector current of said power transistor beyond said prescribed value.

9. The improvement of claim 8 wherein there is also included third means adjustably setting said prescribed value of said collector current.

10. The improvement of claim 9 wherein said OR circuit also includes an output terminal coupled to a voltage controlled attenuator at an input terminal of said amplifier apparatus.

11. The improvement of claim 6 wherein said first means provides said automatic gain control mode of operation in response to variations in the collector voltage of said power transistor and wherein said second means provides said power limiting mode of operation in response to the collector current of said power transistor.

* * * * *